(12) United States Patent
Jiang et al.

(10) Patent No.: US 11,749,532 B2
(45) Date of Patent: Sep. 5, 2023

(54) METHODS AND APPARATUS FOR PROCESSING A SUBSTRATE

(71) Applicant: Applied Materials, Inc., Santa Clara, CA (US)

(72) Inventors: Hao Jiang, San Jose, CA (US); Chi Lu, Cupertino, CA (US); He Ren, San Jose, CA (US); Mehul Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/307,383

(22) Filed: May 4, 2021

(65) Prior Publication Data

US 2022/0359224 A1    Nov. 10, 2022

(51) Int. Cl.
| | |
|---|---|
| H01L 21/3213 | (2006.01) |
| H01L 21/033 | (2006.01) |
| H01J 37/32 | (2006.01) |
| H01L 21/67 | (2006.01) |
| H01L 23/532 | (2006.01) |

(52) U.S. Cl.
CPC .. *H01L 21/32136* (2013.01); *H01J 37/32449* (2013.01); *H01L 21/0332* (2013.01); *H01L 21/32139* (2013.01); *H01L 21/67069* (2013.01); *H01J 37/32183* (2013.01); *H01J 2237/3341* (2013.01); *H01L 23/53242* (2013.01)

(58) Field of Classification Search
CPC ........... H01L 21/32136; H01L 21/0332; H01L 21/32139; H01L 21/67069; H01L 25/53242
See application file for complete search history.

(56) References Cited

U.S. PATENT DOCUMENTS

| | | |
|---|---|---|
| 6,303,512 B1 | 10/2001 | Laermer et al. |
| 6,599,829 B2 | 7/2003 | Smith et al. |
| 6,852,636 B1 | 2/2005 | O'Donnell |
| 8,148,728 B2 | 4/2012 | Or-Bach et al. |
| 8,357,609 B2 | 1/2013 | Ryan |
| 9,865,649 B2 | 1/2018 | Tan et al. |
| 10,553,532 B2 | 2/2020 | Schenker et al. |
| 2002/0139774 A1* | 10/2002 | Hwang ............... C23F 4/00 257/E21.311 |

(Continued)

FOREIGN PATENT DOCUMENTS

KR    10-2017-0019035 A    2/2017

OTHER PUBLICATIONS

PCT International Search Report and Written Opinion PCT/US2022/026329 dated Aug. 11, 2022.

*Primary Examiner* — Binh X Tran
(74) *Attorney, Agent, or Firm* — MOSER TABOADA

(57) ABSTRACT

Methods and apparatus for processing a substrate are provided. For example, a method of processing a substrate comprises supplying oxygen ($O_2$) into a processing volume of an etch chamber to react with a silicon-based hardmask layer atop a base layer of ruthenium to form a covering of an SiO-like material over the silicon-based hardmask layer and etching the base layer of ruthenium using at least one of $O_2$ or chloride ($Cl_2$) while supplying nitrogen ($N_2$) to sputter some of the SiO-like material onto an exposed ruthenium sidewall created during etching.

17 Claims, 2 Drawing Sheets

(56) References Cited

U.S. PATENT DOCUMENTS

| | | |
|---|---|---|
| 2015/0262869 A1 | 9/2015 | Naik et al. |
| 2019/0311915 A1* | 10/2019 | Nagatomo ........ H01L 21/67069 |
| 2019/0348322 A1* | 11/2019 | Mullick ............ H01L 21/76807 |
| 2021/0233770 A1* | 7/2021 | Ren ........................ C23C 14/568 |
| 2022/0199422 A1 | 6/2022 | Yang et al. |

* cited by examiner

US 11,749,532 B2

METHODS AND APPARATUS FOR PROCESSING A SUBSTRATE

FIELD

Embodiments of the present disclosure generally relate to methods and apparatus for processing a substrate, and more particularly, to methods and apparatus for etching one or more metal layers with silicon-based hardmask.

BACKGROUND

As reductions in device scaling continue, front-end-of-line (FEOL) transistor size becomes smaller, and a number of transistors per unit area increases. Correspondingly, back-end-of-line (BEOL) metal interconnect line pitch decreases (e.g., <30 nm pitch). Subtractive interconnect (e.g., chemical etch) of one or more metals (e.g., tungsten, ruthenium, molybdenum, etc.) can be used to deliver lower resistance with respect to copper or cobalt damascene. Ruthenium, for example, is widely used in interconnect scaling in advanced logic nodes because of ruthenium's low resistivity and integration compatibility with dielectric fill. However, as ruthenium lines are sometimes required to be patterned in tight pitch, controlling profile, sidewall smoothness, and line edge roughness during patterning is often difficult to achieve.

SUMMARY

Methods and apparatus for processing a substrate are provided herein. In some embodiments, a method for processing a substrate includes supplying oxygen ($O_2$) into a processing volume of an etch chamber to react with a silicon-based hardmask layer atop a base layer of ruthenium to form a covering of an SiO-like material over the silicon-based hardmask layer and etching the base layer of ruthenium using at least one of $O_2$ or chloride ($Cl_2$) while supplying nitrogen ($N_2$) to sputter some of the SiO-like material onto an exposed ruthenium sidewall created during etching.

In accordance with at least some embodiments a non-transitory computer readable storage medium has stored thereon instructions that when executed by a processor perform a method of a processing a substrate. The method includes supplying oxygen ($O_2$) into a processing volume of an etch chamber to react with a silicon-based hardmask layer atop a base layer of ruthenium to form a covering of an SiO-like material over the silicon-based hardmask layer and etching the base layer of ruthenium using at least one of $O_2$ or chloride ($Cl_2$) while supplying nitrogen ($N_2$) to sputter some of the SiO-like material onto an exposed ruthenium sidewall created during etching.

In accordance with at least some embodiments an etch chamber includes a gas panel configured to supply an etchant into a processing volume of the etch chamber; a controller configured to supply oxygen ($O_2$) into the processing volume of the etch chamber to react with a silicon-based hardmask layer atop a base layer of ruthenium to form a covering of an SiO-like material over the silicon-based hardmask layer and etch the base layer of ruthenium using at least one of $O_2$ or chloride ($Cl_2$) while supplying nitrogen ($N_2$) to sputter some of the SiO-like material onto an exposed ruthenium sidewall created during etching Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
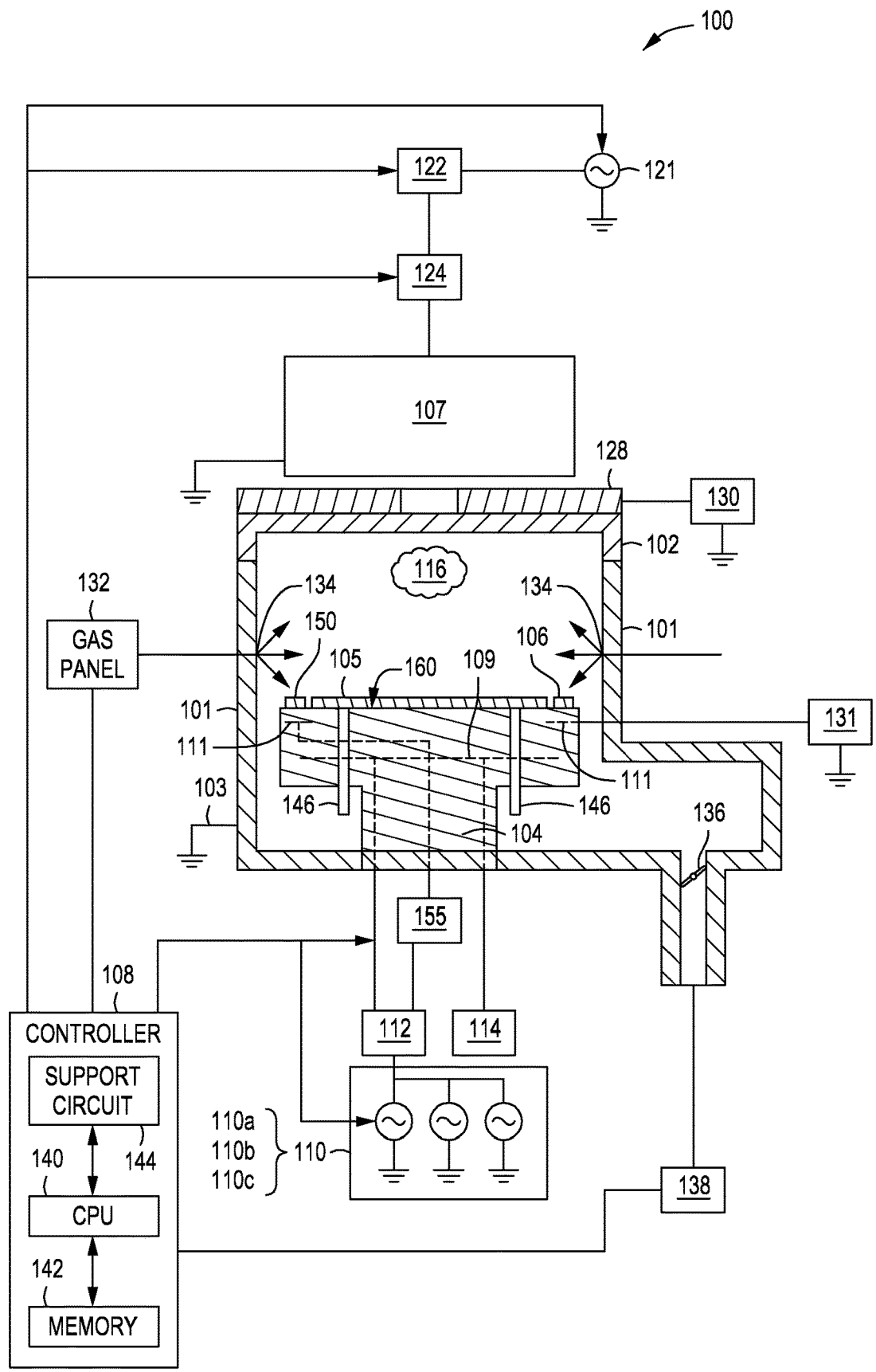
FIG. 1 is a schematic sectional view of a processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a processing a substrate are provided herein. For example, in at least some embodiments, methods described herein comprise treating a hardmask (e.g., silicon-based, such as silicon oxide (SiO), silicon nitride (SiN), silicon carbide (SiC), etc.) disposed on a metal layer with one or more process gases (e.g., oxygen ($O_2$)) to form a SiO-like covering over the hardmask. The metal layer is subsequently etched using, for example, $O_2$ and/or chloride ($Cl_2$). Nitrogen ($N_2$) can be provided during etching to assist sputtering of the treated hardmask to the exposed metal sidewall (e.g., a passivation layer), thus providing a smooth sidewall. The methods and apparatus described herein are configured to achieve a smooth and controllable sidewall profile having a pitch of about 14 nm to about 28 nm. A smooth ruthenium sidewall provides low line resistance (e.g., minimal surface scattering) and combability (e.g., adhesion, reliability, etc.) with subsequent dielectric fill.

FIG. 1 is a schematic sectional view of a processing chamber 100, in accordance with at least some embodiments of the disclosure. The processing chamber 100 includes a chamber body 101 and a lid 102 disposed thereon that together define an inner volume (a processing volume 113). The chamber body 101 is typically coupled to an electrical ground 103.

The processing chamber 100 can be one of an inductively coupled plasma (ICP) chamber, and/or a capacitively coupled plasma (CCP) chamber. For example, in at least some embodiments, the processing chamber 100 is a chamber including a CCP apparatus 107 on top. In at least some embodiments, the top of the processing chamber 100 can be grounded. The CCP apparatus 107 generates a plasma of reactive species within the processing chamber 100, and a system controller 108 is adapted to control systems and subsystems of the processing chamber 100, as described above.

A substrate support assembly 104 is disposed within the inner volume to support a substrate 105 thereon during processing (use). An edge ring 106 is positioned around the periphery of the substrate 105 on the substrate support assembly 104. The edge ring 106 is disposed on and surrounds a substrate support surface of an electrostatic chuck (e.g., the substrate support assembly 104). The substrate support assembly 104 includes one or more electrodes, such as a first electrode 109 and a second electrode, such as a ring electrode 111 surrounding the first electrode 109. The first electrode 109 and the ring electrode 111 are each coupled to multiple RF power sources 110 providing different frequencies through a matching network 112 and an edge tuning circuit 155 (e.g., hereinafter simply referred to as an edge tuning circuit 155) including variable capacitors and inductors. The matching network 112 ensures that the output of the RF power sources 110 are effectively coupled to the plasma to maximize the energy coupled to the plasma. The matching network 112 typically matches 50 ohms to the complex impedance of the plasma. To facilitate dynamic matching as the plasma characteristics change during processing, the matching network 112 can be continuously adjusted to ensure that a match is maintained throughout the process.

The edge tuning circuit 155 is an RF circuit that operates near resonance which enables adjusting a voltage higher or/and lower than a source voltage, as described in greater detail below. The RF power sources 110 are utilized to bias the substrate 105 disposed on an upper surface 160 of the substrate support assembly 104. The RF power sources 110 may illustratively be a source of up to about 10,000 W (but not limited to about 10,000 W) of RF energy, which may be provided at one or multiple frequencies, such as 400 kHz, 2 MHz, 13.56 MHz, 27 MHz, 40 MHz, or 60 MHz. The RF power sources 110 can include two or more independent RF power sources that are configured to provide RF energy at two or more corresponding frequencies. For example, in at least some embodiments, the RF power sources 110 can include an RF power source 110a and an RF power source 110b each configured to provide RF energy at a corresponding frequency, e.g., 400 kHz and 2 MHz, and an optional RF power source 110c can be provided and can be configured to provide RF energy at a frequency of 400 kHz, 2 MHz, and/or 40 MHz. The RF power sources 110 may be capable of producing either or both of continuous or pulsed power. The first electrode 109 is coupled to a chucking power source 114 to facilitate chucking of the substrate 105 to the upper surface 160 during processing.

The CCP apparatus 107 is disposed above the lid 102 and is configured to capacitively couple RF power into the processing chamber 100 to generate a plasma 116 within the processing chamber 100. The CCP apparatus 107 can be adjusted as desired to control the profile or density of the plasma 116 being formed. The CCP apparatus 107 is coupled to an RF power supply 121 through a matching network 122 (similar to the matching network 112) via an RF feed structure 124. The RF power supply 121 may illustratively be capable of producing up to about 60,000 W (but not limited to about 60,000 W) at a tunable frequency in a range from 50 kHz to 150 MHz, although other frequencies and powers may be utilized as desired for particular applications.

In some examples, a power divider (not shown), such as a dividing capacitor, may be provided between the RF feed structure 124 and the RF power supply 121 to control the relative quantity of RF power provided. For example, in embodiments when processing chamber 100 includes an ICP apparatus, the power divider may be used. In such embodiments, the power divider may be incorporated into the matching network 122.

A heater element 128 may be disposed on the lid 102 to facilitate heating the interior of the processing chamber 100. The heater element 128 may be disposed between the lid 102 and a plasma apparatus, such as the CCP apparatus 107. In some examples, the heater element 128 may include a resistive heating element and may be coupled to a power supply 130, such as an AC power supply, configured to provide sufficient energy to control the temperature of the heater element 128 within a desired range.

During operation, the substrate 105, such as a semiconductor wafer or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases (e.g., etchant) are supplied from a gas panel 132 through entry ports 134 into the inner volume of the chamber body 101. The process gases are ignited into a plasma 116 in the processing chamber 100 by applying power from the RF power supply 121 to the CCP apparatus 107. In some examples, power from the RF power sources 110 may also be provided through the matching network 112 to the first electrode 109 and/or the edge ring 106 within the substrate support assembly 104. Alternatively or additionally, power from the RF power sources 110, e.g., two or more of the RF power sources 110a-110c may also be provided through the matching network 112 to a baseplate and/or other electrode within the substrate support assembly 104. In at least some embodiments, a DC power source 131 can be connected to the substrate support assembly 104 (e.g., to the ring electrode 111) and configured to provide a clamping force to clamp the edge ring 106 to the substrate support (e.g., to a ceramic ring 250 disposed on the substrate support as described below), e.g., to improve thermal control of the edge ring 106, during operation.

The pressure within the interior of the processing chamber 100 may be controlled using a valve 136 and a vacuum pump 138. The temperature of the chamber body 101 may be controlled using fluid-containing conduits (not shown) that run through the chamber body 101.

The processing chamber 100 includes the system controller 108 to control the operation of the processing chamber 100 during processing. The system controller 108 comprises a central processing unit 140, a memory 142 (e.g., non-transitory computer readable storage medium), and support circuits 144 for the central processing unit 140 and facilitates control of the components of the processing chamber 100. The system controller 108 may be one of any form of general-purpose computer processor that can be used in an industrial setting for controlling various chambers and sub-processors. The memory 142 stores instructions (e.g., software (source or object code)) that may be executed or invoked to control the operation of the processing chamber 100 in the manner described herein.

Figure 2:
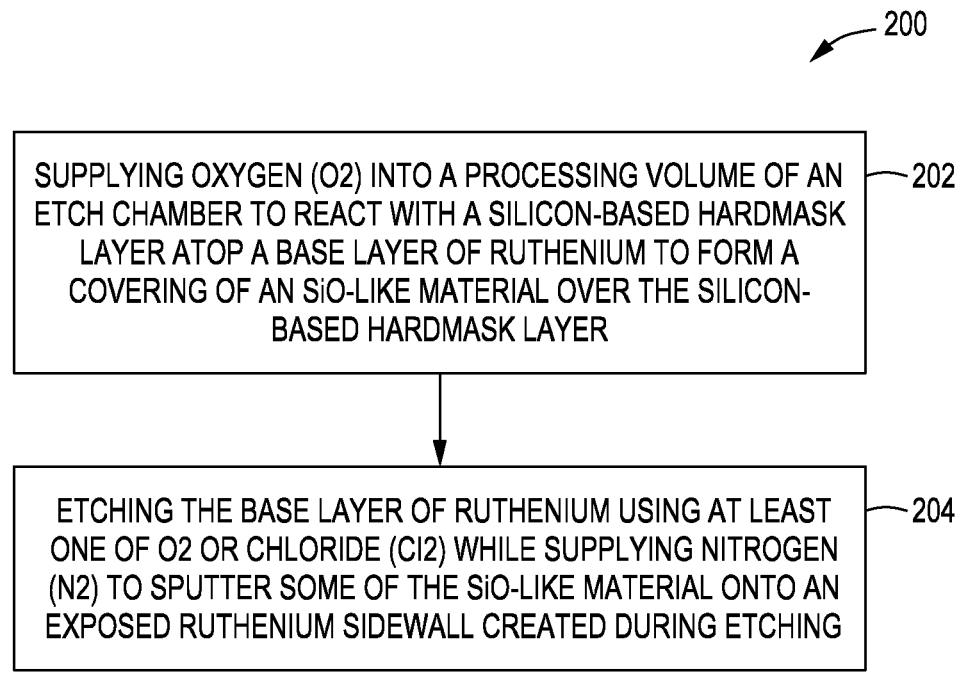
FIG. 2 is a flowchart of a method for processing a substrate, in accordance with at least some embodiments of the present disclosure.
Figure 3:
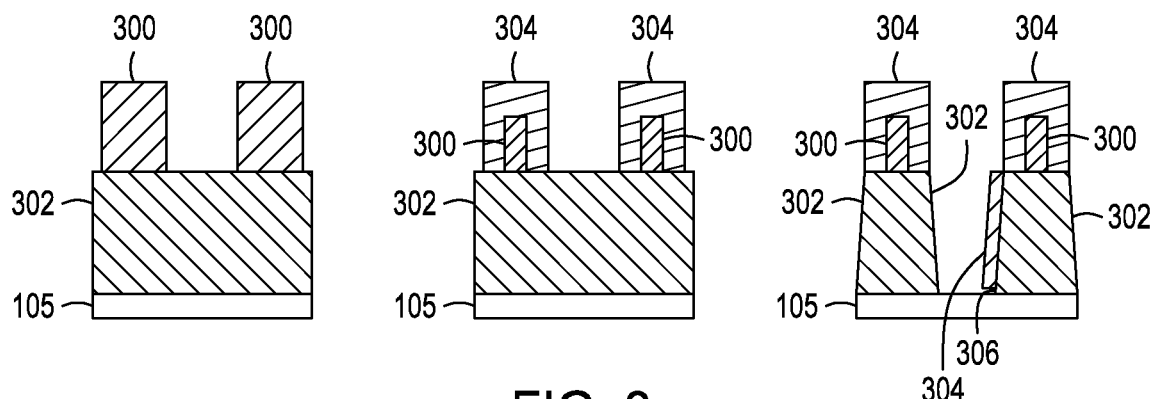
FIG. 3 is a sequencing diagram corresponding to the flowchart of FIG. 2.

FIG. 2 is a flowchart of a method 200 for processing a substrate (e.g., the substrate 105) and FIG. 3 is a sequencing diagram corresponding to the flowchart of FIG. 2.

For example, the method 200 comprises a two-step etch process (e.g., ruthenium etch) to achieve smooth sidewall and controllable profile for ruthenium etch in pitch of less than about 28 nm. For example, at 202 the method 200 comprises supplying oxygen ($O_2$) into a processing volume (e.g., the processing volume 113) of an etch chamber (e.g., the processing chamber 100) to react with a silicon-based hardmask layer 300 atop a base layer of ruthenium 302 to form a covering of an SiO-like material 304 over the silicon-based hardmask layer 300 (FIG. 3). For example, the system controller 108 can be configured to supply oxygen (O$_2$) via the gas panel 132 into a processing volume. At 202, the process parameters can comprise a source power (e.g., RF power supply 121) of about 1500 W at an operating frequency from about 50 kHz to about 150 MHz, a bias power (e.g., RF power sources 110) of about 40 W at an operating frequency from about 400 kHz to about 60 MHz. In at least some embodiments, the operating power and the bias power can be provided at the same frequency. Additionally, at 202 a substrate support assembly temperature (e.g., a chuck temperature) can be about 50° C., a pressure inside the etch chamber can be about 10 mTorr, and the O$_2$ can be provided at about 200 sccm. In at least some embodiments, the silicon-based hardmask layer 300 comprises at least one of silicon (Si), silicon oxide (SiO), silicon nitride (SiN), or silicon carbide (SiC).

Next, at 204, the method 200 comprises etching the base layer of ruthenium 302 using at least one of O$_2$ or chloride (Cl$_2$) while supplying nitrogen (N$_2$) to sputter (illustrated by the directional arrows) some of the SiO-like material 304 onto one or both of an exposed ruthenium sidewall 306 created during etching (e.g., the sputtered SiO-like material 304 provides a passivation layer on one or both of the exposed ruthenium sidewall 306). At 204 the process parameters can comprise a source power (e.g., RF power supply 121) of about 500 W at an operating frequency from about 50 kHz to about 150 MHz, a bias power (e.g., RF power sources 110) of about 200 W at an operating frequency from about 400 kHz to about 60 MHz. In at least some embodiments, the operating power and the bias power can be provided at the same frequency with a bias pulsing ratio of about 30%. Additionally, at 204 a chuck temperature can be about 50° C., a pressure inside the etch chamber can be about 10 mTorr, and the O$_2$ (if used) can be provided at about 200 sccm, Cl$_2$ (if used) can be provided at about 40 sccm, and N$_2$ can be provided at about 20 sccm to about 200 sccm (e.g., 50 sccm). For illustrative purposes, only one of the exposed ruthenium sidewall 306 is shown having the SiO-like material 304 sputtered thereon. In the illustrated embodiment, the base layer of ruthenium 302 is shown etched to the substrate 105 (e.g., etch stop layer). Alternatively, the etch process can comprise etching through the substrate 105. The SiO-like material 304 sputtered material protects the exposed ruthenium sidewall 306 from lateral etch, resulting in smooth sidewalls.

A ruthenium line profile can be controlled. For example, in at least some embodiments, the method 200 can comprise tuning a line profile of the exposed ruthenium sidewall 306 by adjusting an amount (flow rate) of the N$_2$ supplied to sputter the SiO-like material 304. For example, in at least some embodiments, the N$_2$ can be provided (tuned) between 20 and 200 sccm (e.g., to about 50 sccm). For example, the greater the amount of N$_2$ supplied to sputter the SiO-like material 304, the slower the ruthenium sidewall 306 will be etched (e.g., due to greater passivation of the ruthenium sidewall 306), which will provide a more tapered sidewall profile.

In at least some embodiments, the method 200 can comprise etching the base layer of ruthenium 302 to form multiple interconnect lines. For example, in at least some embodiments, the multiple interconnect lines can have a pitch of about 14 nm to about 28 nm (e.g., about 24 nm).

While the foregoing is directed to embodiments of the present disclosure, other and further embodiments of the disclosure may be devised without departing from the basic scope thereof.

The invention claimed is:

1. A method of processing a substrate, comprising:
    supplying oxygen (O$_2$) into a processing volume of an etch chamber to react with a silicon-based hardmask layer atop a base layer of ruthenium to form a covering of an SiO over the silicon-based hardmask layer;
    etching the base layer of ruthenium using at least one of O$_2$ or chloride (Cl$_2$) while supplying nitrogen (N$_2$) to sputter some of the SiO onto an exposed ruthenium sidewall created during etching,
    wherein etching the base layer of ruthenium further comprises providing:
    a source power at a first power level at an operating frequency from about 50 KHz to about 150 MHz; and
    a bias power at a second power level different from the first power level at an operating frequency from about 400 KHz to about 60 MHz; and
    tuning a line profile of the exposed ruthenium sidewall by adjusting a flow rate of the nitrogen (N$_2$) supplied to sputter the SiO to about 200 sccm to control an amount of the base layer of ruthenium that is etched.

2. The method of claim 1, further comprising etching the base layer of ruthenium to form multiple interconnect lines.

3. The method of claim 2, wherein the multiple interconnect lines have a pitch of about 14 nm to about 28 nm.

4. The method of claim 2, wherein the multiple interconnect lines have a pitch of about 24 nm.

5. The method of claim 1, wherein the silicon-based hardmask layer comprises at least one of silicon (Si), silicon oxide (SiO), silicon nitride (SiN), or silicon carbide (SiC).

6. The method of claim 1, wherein supplying oxygen (O$_2$) into the processing volume further comprises providing:
    a source power of about 1500 W at an operating frequency from about 50 kHz to about 150 MHz;
    a bias power of about 40 W at an operating frequency from about 400 kHz to about 60 MHZ;
    a chuck temperature of about 50° C.;
    a pressure inside the etch chamber of about 10 mTorr; and
    the oxygen (O$_2$) at about 200 sccm.

7. The method of claim 1, wherein the first power level is about 500 W and the second power level is about 200 W and etching the base layer of ruthenium further comprises providing:
    a chuck temperature of about 50° C.;
    a pressure inside the etch chamber of about 10 mTorr;
    the oxygen (O$_2$) at about 200 sccm when used; and
    the chloride (Cl$_2$) at about 40 sccm when used.

8. A non-transitory computer readable storage medium having stored thereon instructions that when executed by a processor perform a method of a processing a substrate, the method comprising:
    supplying oxygen (O$_2$) into a processing volume of an etch chamber to react with a silicon-based hardmask layer atop a base layer of ruthenium to form a covering of SiO over the silicon-based hardmask layer;
    etching the base layer of ruthenium using at least one of O$_2$ or chloride (Cl$_2$) while supplying nitrogen (N$_2$) to sputter some of the SiO onto an exposed ruthenium sidewall created during etching,
    wherein etching the base layer of ruthenium further comprises providing:
    a source power at a first power level at an operating frequency from about 50 KHz to about 150 MHz; and
    a bias power at a second power level different from the first power level at an operating frequency from about 400 kHz to about 60 MHz; and tuning a line profile of the exposed ruthenium sidewall by adjusting a flow rate of the nitrogen ($N_2$) supplied to sputter the SiO to about 200 sccm to control an amount of the base layer of ruthenium that is etched.

9. The non-transitory computer readable storage medium of claim 8, further comprising etching the base layer of ruthenium to form multiple interconnect lines.

10. The non-transitory computer readable storage medium of claim 9, wherein the multiple interconnect lines have a pitch of about 14 nm to about 28 nm.

11. The non-transitory computer readable storage medium of claim 9, wherein the multiple interconnect lines have a pitch of about 24 nm.

12. The non-transitory computer readable storage medium of claim 8, wherein the silicon-based hardmask layer comprises at least one of silicon (Si), silicon oxide (SiO), silicon nitride (SiN), or silicon carbide (SiC).

13. The non-transitory computer readable storage medium of claim 8, wherein supplying oxygen ($O_2$) into the processing volume further comprises providing:
    a source power of about 1500 W at an operating frequency from about 50 kHz to about 150 MHz;
    a bias power of about 40 W at an operating frequency from about 400 KHz to about 60 MHZ;
    a chuck temperature of about 50° C.;
    a pressure inside the etch chamber of about 10 mTorr; and
    the oxygen ($O_2$) at about 200 sccm.

14. The non-transitory computer readable storage medium of claim 8, wherein the first power level is about 500 W and the second power level is about 200 W and etching the base layer of ruthenium further comprises providing:
    a chuck temperature of about 50° C.;
    a pressure inside the etch chamber of about 10 mTorr;
    the oxygen ($O_2$) at about 200 sccm when used; and
    the chloride ($Cl_2$) at about 40 sccm when used.

15. An etch chamber, comprising:
    a gas panel configured to supply an etchant into a processing volume of the etch chamber;
    a controller configured to:
    supply oxygen ($O_2$) into the processing volume of the etch chamber to react with a silicon-based hardmask layer atop a base layer of ruthenium to form a covering of SiO over the silicon-based hardmask layer;
    etch the base layer of ruthenium using at least one of $O_2$ or chloride ($Cl_2$) while supplying nitrogen ($N_2$) to sputter some of the SiO onto an exposed ruthenium sidewall created during etching,
    wherein etching the base layer of ruthenium further comprises providing:
    a source power at a first power level at an operating frequency from about 50 kHz to about 150 MHz; and
    a bias power at a second power level different from the first power level at an operating frequency from about 400 KHz to about 60 MHz; and
    tune a line profile of the exposed ruthenium sidewall by adjusting a flow rate of the nitrogen ($N_2$) supplied to sputter the SiO to about 200 sccm to control an amount of the base layer of ruthenium that is etched.

16. The etch chamber of claim 15, wherein the controller is further configured to etch the base layer of ruthenium to form multiple interconnect lines.

17. The etch chamber of claim 16, wherein the multiple interconnect lines have a pitch of about 14 nm to about 28 nm.

* * * * *